US007839233B2

(12) United States Patent
Zhao et al.

(10) Patent No.: US 7,839,233 B2
(45) Date of Patent: Nov. 23, 2010

(54) ATTENUATOR

(75) Inventors: Yibing Zhao, Newton, MA (US); Shuyun Zhang, Allston, MA (US)

(73) Assignee: Analog Devices, Inc., Norwood, MA (US)

( * ) Notice: Subject to any disclaimer, the term of this patent is extended or adjusted under 35 U.S.C. 154(b) by 296 days.

(21) Appl. No.: 12/009,919

(22) Filed: Jan. 23, 2008

(65) Prior Publication Data

US 2009/0184785 A1 Jul. 23, 2009

(51) Int. Cl.
*H01P 1/22* (2006.01)
*H03H 7/24* (2006.01)

(52) U.S. Cl. .................................... 333/81 R; 327/308

(58) Field of Classification Search ............... 333/81 R, 333/81 A; 327/308, 309
See application file for complete search history.

(56) References Cited

U.S. PATENT DOCUMENTS 4,837,530 A * 6/1989 Kondoh .................... 333/81 A
5,903,177 A 5/1999 Schwab et al.
6,448,867 B1 * 9/2002 Kossor ..................... 333/81 A
6,919,774 B2 * 7/2005 Ritchey et al. ............ 333/81 R

OTHER PUBLICATIONS

Inamori, M. et al., "A New GaAs Variable Gain Amplifier MMIC with a Wide-Dynamic-Range and Low-Voltage-Operation Linear Attenuation Circuit," MOM3-3, *IEEE Radio Frequency Integrated Circuits Symposium*, (1999) pp. 39-42.

Sun, H. J. et al., "A 2-18GHz Monolithic Variable Attenuator Using Novel Triple-Gate Mesfets," *IEEE MTT-S Digest*, (1990) pp. 777-780.

* cited by examiner

*Primary Examiner*—Stephen E Jones
(74) *Attorney, Agent, or Firm*—Knobbe, Martens, Olson & Bear LLP

(57) ABSTRACT

A π-type voltage-controlled variable attenuator is disclosed. The variable attenuator may include variably resistive components in the series and shunt arms. The variably resistive components may be implemented as field effect transistors. The shunt arms may be coupled to the series arm, and the variable attenuator may lack capacitors between the series arm and shunt arms. The series arm and shunt arms may display variable resistances which, in combination, operate to provide a variable level of attenuation of an input signal. The variable attenuator may provide any level of attenuation of an input signal over a wide frequency range. The variable attenuator may be implemented as an integrated circuit.

33 Claims, 7 Drawing Sheets

ATTENUATOR

BACKGROUND

1. Field

The technology described herein relates to attenuators.

2. Discussion of Related Art

Attenuators are devices, sometimes implemented as circuits, which provide an output signal that is attenuated relative to a corresponding input signal. For instance, an input signal having an initial energy may be input to an attenuator, which then outputs an output signal having an attenuated energy relative to the initial energy. Attenuators may be useful in any system or circuit that requires control of signal gain, such as communications systems, medical devices, cellular telephone base stations, industrial instruments, and consumer electronics, to name a few.

Integrated circuit (IC) attenuators can be formed in various materials, and are sometimes formed in compound semiconductor materials, such as gallium arsenide (GaAs). The properties of a given material, such as GaAs, may influence the design of the integrated circuit attenuator implemented in the material. For example, integrated circuit attenuators may implement one or more transistors, as passive components or otherwise. Transistors made in GaAs are typically depletion mode transistors, and thus have a negative threshold voltage $V_{TH}$, also referred to as the pinch-off voltage $V_p$. To use depletion mode transistors as passive components (e.g., variable resistors) thus requires the ability to have a negative control voltage, i.e., a negative gate-to-source ($V_{gs}$) voltage. However, IC attenuators are often implemented in an environment (e.g., a larger circuit) for which the standard supply voltages are positive. Thus, design of an IC attenuator in some types of materials may reflect the contrast between a need for a negative control voltage for some components and the lack of a negative supply voltage.

FIG. 1 illustrates a conventional π-type voltage-controlled variable attenuator which can be implemented as an IC in GaAs, and which allows for control of the depletion mode field effect transistors (FETs) using positive voltages. The attenuator 100 has a series arm including two field effect transistors, FET1 and FET2. The source of FET1 is coupled to the drain of FET2. The attenuator input AC Input is provided to DC block capacitor C101, which is coupled to the drain of FET1. The signal transmitted along the series arm of attenuator 100 passes from FET2 to DC block capacitor C102, which is coupled to the source of FET2. The attenuator output AC Output is provided by DC block capacitor C102.

The attenuator 100, being a π-type attenuator, includes two shunt arms coupled to the series arm, which provide impedance matching of the attenuator with other components and/or circuits to which the attenuator may be coupled. The first shunt arm includes DC block capacitor C103, FET3, and DC block capacitor C105, which is coupled to ground. The second shunt arm includes DC block capacitor C104, FET4, and DC block capacitor C106, which is coupled to ground. As shown, the attenuator 100 also includes multiple resistors (R101-R107), described more fully below.

Broadly speaking, the attenuator 100 provides a variable amount of attenuation of input signal AC Input, ranging from a small degree, or amount, of attenuation to a large degree of attenuation. The degree of attenuation is determined by the interaction, and more specifically the resistances, of the series and shunt arms, and thus by the bias conditions of the FETs, described more fully below. In attenuator 100, the resistance of the series arm generally moves in an opposite direction from that of the shunt arms. When the resistance of the shunt arms is large, the resistance of the series arm is small, and the output signal AC Output is only slightly attenuated compared to the input signal AC Input. If the resistance of the series arm is large, the resistance of the shunt arms is small, and AC Output is significantly attenuated compared to AC Input.

A more detailed understanding of the operation of attenuator 100 can be gained by considering the various operating states of the FETs. The FETs are depletion mode transistors (meaning they have a negative threshold, or pinch-off, voltage) and are configured as passive components (i.e., variable resistors). There are three operating states for each transistor to consider:

$$V_{gs} \geqq 0 \qquad \text{State 1}$$

$$V_{TH} \leqq V_{gs} < 0 \qquad \text{State 2}$$

$$V_{gs} < V_{TH} \qquad \text{State 3}$$

where $V_{gs}$ is the gate-to-source voltage of the transistor and $V_{TH}$ is the threshold voltage of the transistor. In State 1, $V_{gs} \geqq 0$, the transistor is fully ON (conducting), meaning its resistance is approximately zero, and thus it operates as a short circuit. In State 2, $V_{TH} \leqq V_{gs} < 0$, the transistor is ON and has a variable resistance that depends on the value of $V_{gs}$. State 2 is the linear region of operation. In State 3, $V_{gs} < V_{TH}$, the transistor is OFF, meaning it has an approximately infinite resistance and operates like an open circuit.

With that background, the operation of attenuator 100 can be understood in detail. As mentioned, the attenuator 100 provides a variable degree of attenuation of the input signal AC Input depending on the resistances of the series and shunt arms. As explained, the resistance of each FET in attenuator 100 depends on the voltage potentials at the gate and body (i.e., source and drain), also referred to as the bias condition, of that FET. In attenuator 100, these voltages depend on the relative values of Vref and Vctrl.

The voltage Vref is a positive constant voltage, and is applied to node 103 through resistor R101. The bodies of FET1 and FET2 (i.e., nodes 101, 102, and 103) all have voltages approximately equal to the value of Vref because of the presence of DC block capacitors C101, C102, C103, and C104, which provide some isolation of FET1 and FET2 from the rest of the attenuator. The voltage potentials at the gate of FET1 (node 104) and the gate of FET2 (node 109) are controlled by Vctrl, a variable voltage source having positive voltage values. Vctrl is applied to nodes 104 and 109 through resistors R102 and R103, respectively. Thus, the gate-to-source voltages $V_{gs}$ for FET1 and FET2 (approximately equal to the gate-to-drain voltage $V_{gd}$ in this configuration) are both approximately given by: $V_{gs}=V_{gd}=$Vctrl−Vref. By varying Vctrl between 0 Volts as a lower limit and approximately Vref as an upper limit, $V_{gs}$ (and $V_{gd}$) for FET1 and FET2 will vary from approximately −Vref to approximately zero. Therefore, the resistance values of FET1 and FET2 can be controlled. Moreover, if Vref is greater than or equal to the absolute value of the threshold voltage $V_{TH}$ of the FETs, all three operating states of transistors FET1 and FET2, described above, can be achieved.

Meanwhile, the voltage potential at the drains and sources of FET3 and FET4, i.e., nodes 105, 106, 108, and 111, are controlled by the variable voltage Vctrl. As shown, Vctrl is applied to node 105 through resistor RI 04, and to node 106 through resistor R105. The gate terminals of FET3 and FET4 (i.e., nodes 107 and 110) are coupled to ground through resistors R106 and R107, respectively. Thus, $V_{gs}$ and $V_{gd}$ for FET3 and FET4 are approximately given by: $V_{gs}=V_{gd}=-$Vctrl. By varying Vctrl from approximately 0 Volts as a lower limit to approximately Vref as an upper limit, $V_{gs}$ (and $V_{gd}$) for FET3 and FET4 will vary from approximately 0 Volts to −Vref. Therefore, the resistance values of FET3 and FET4 can be controlled. Moreover, if Vref is greater than or equal to the absolute value of the threshold voltage $V_{TH}$ of the FETs, all three operating states of transistors FET3 and FET4, described above, can be achieved.

Several aspects of the design and operation of attenuator 100 can be noted. While $V_{gs}$ for FET1 and FET2 varies from approximately zero to −Vref, the value of $V_{gs}$ for FET3 and FET4 is varying from −Vref to zero. Therefore, FET1 and FET2 will display decreasing resistances when FET3 and FET4 display increasing resistances, and vice versa. The presence of DC block capacitors C103 and C104 provides some degree of isolation of the series arm from the shunt arms, and thus enables the opposing behavior of the resistances of the series and shunt arms in attenuator 100. Moreover, at least some of the nodes of the attenuator (e.g., nodes 101, 102, and 103) maintain an approximately constant voltage during operation, while the nodes at the bodies of the FETs in the shunt arms (e.g., nodes 105, 106, 108, and 111) experience a varying voltage during operation.

FIG. 2 shows the small signal equivalent of attenuator 100 in FIG. 1. In circuit 200, each transistor FETn (n is the index of the transistor, i.e., n=1, 2, 3, or 4), is simplified to be a resistance RFETn in parallel with a capacitance CFETn. Both RFETn and CFETn vary according to the bias condition (i.e., the value of $V_{gs}$) of the corresponding transistor. When Vctrl is 0 Volts, as described above, FET1 and FET2 are biased to be in the OFF-state (assuming the absolute value of Vref is greater than the absolute value of $V_{TH}$), and FET3 and FET4 are in the ON-state. Thus, RFET1 and RFET2 approach their maximum values while RFET3 and RFET4 approach their minimum values. In this state, the attenuator provides the maximum loss (i.e., maximum attenuation) to the AC Input signal. When Vctrl is set to Vref, FET1 and FET2 are in the ON-state and FET3 and FET4 in the OFF-state. Thus, RFET1 and RFET2 approach their minimum values, while RFET3 and RFET4 approach their maximum values. In this state, the attenuation level of AC Input approaches its minimum value. When Vctrl is set between 0 Volts and Vref, the π-type resistor network provides an attenuation level varying between its maximum and minimum values, thus realizing an analog variable attenuator. Resistors R101, R104, and R105 have large resistance values relative to the variable resistances RFETn, and therefore have less influence on the performance of the attenuator.

SUMMARY

According to an aspect of the present invention, a π-type voltage-controlled variable attenuator is provided. The attenuator comprises a series arm configured to receive an input signal and output an attenuated signal. The series arm comprises a first variably resistive component, and a second variably resistive component coupled in series with the first variably resistive component. The attenuator further comprises a first shunt arm comprising a third variably resistive component, the first shunt arm coupled to the first variably resistive component. The attenuator further comprises a second shunt arm comprising a fourth variably resistive component, the second shunt arm coupled to the second variably resistive component. The attenuator lacks a capacitor configured to isolate the first variably resistive component from the first shunt arm, and lacks a capacitor configured to isolate the second variably resistive component from the second shunt arm.

According to another aspect of the present invention, a voltage-controlled variable attenuator is provided. The attenuator comprises a series arm comprising a first variably resistive component and a second variably resistive component, the series arm configured to receive an input signal and provide an output signal attenuated relative to the input signal. The attenuator further comprises a first shunt arm coupled to the series arm. The first shunt arm comprises a third variably resistive component, and a first capacitor having a first terminal coupled to the third variably resistive component at a first node and a second terminal coupled to ground. The attenuator further comprises a second shunt arm coupled to the series arm. The second shunt arm comprises a fourth variably resistive component, and a second capacitor having a first terminal coupled to the fourth variably resistive component at a second node and a second terminal coupled to ground. The attenuator further comprises a first resistor having a first terminal coupled to a variable voltage and a second terminal coupled to the first node, and a second resistor having a first terminal coupled to the variable voltage and a second terminal coupled to the second node.

According to another aspect of the present invention, an analog voltage-controlled variable attenuator is provided. The attenuator comprises a series arm configured to receive an input signal having a frequency f and provide an output signal representing an attenuation of the input signal. The attenuator further comprises a first shunt arm coupled to the series arm, and a second shunt arm coupled to the series arm. The series arm, first shunt arm, and second shunt arm are operable in combination to attenuate the input signal by a percentage in the range from approximately 0% attenuation to approximately 100% attenuation for the input signal having a frequency f anywhere in the range from approximately 700 MHz to approximately 40 GHz.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
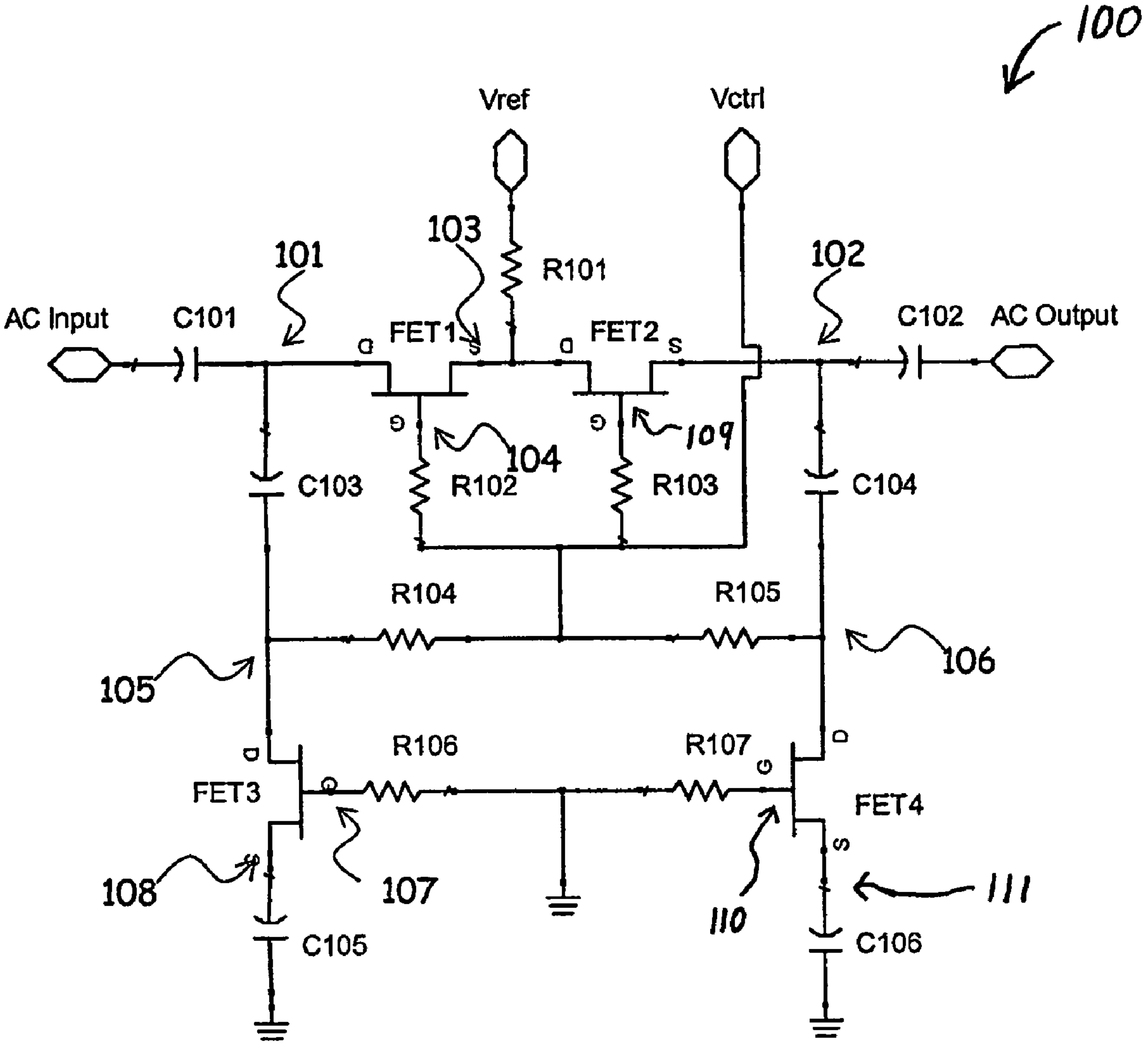
Figure 1. Prior art
FIG. 1 is a schematic diagram of a conventional π-type voltage-controlled variable attenuator.
Figure 2:
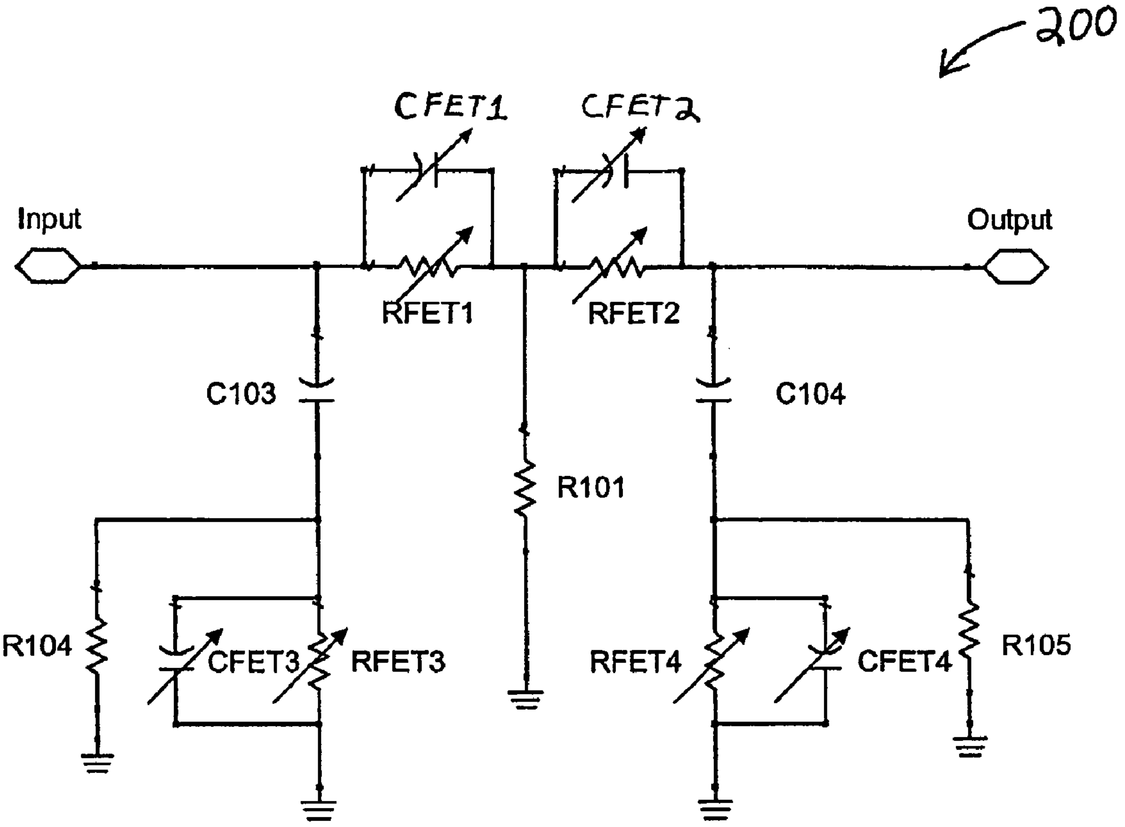
Figure 2. Prior art
FIG. 2 is a schematic diagram of a simplified small signal equivalent circuit of the conventional π-type voltage-controlled variable attenuator of FIG. 1.

As shown in FIG. 1, conventional IC π-type attenuators contain DC block capacitors between the series arm and the two shunt arms. The DC block capacitors prevent DC crosstalk between the series and shunt arms, thus allowing separate control of the bias conditions of the transistors in the series arm and the transistors in the shunt arms. However, the DC block capacitors between the series and shunt arms have several drawbacks. For example, the DC block capacitors inhibit operation of the attenuator at low frequencies (e.g., below 800 MHz) because of their high impedance at low frequency. Because it may be desirable to have an attenuator that can operate across a wide frequency range (i.e., high frequency as well as low frequency), the DC block capacitors are problematic.

Furthermore, the DC block capacitors C103 and C104 create space problems. Specifically, because the DC block capacitors C103 and C104 are internal to the attenuator circuit, they are often implemented on-chip. These capacitors may be large relative to the other circuitry in the attenuator and may consume a large amount of chip area. For example, the DC block capacitors C103 and C104 may consume roughly half of the total chip area needed for the attenuator, and may consume up to 0.1 $mm^2$ of chip area, depending on their values.

Further still, on-chip capacitors, such as DC block capacitors C103 and C104, are frequently formed by metal-insulator-metal structures, which are subject to electrostatic discharge (ESD). The occurrence of ESD can damage the capacitors and/or other components of the attenuator circuit, thus rendering the attenuator useless.

According to an aspect of the present invention, a π-type positive voltage-controlled variable attenuator is provided that lacks DC block capacitors between the series arm and the two shunt arms. The attenuator may provide one or more benefits over conventional attenuators, such as accurate operation over a wider frequency range than conventional attenuators, reduced consumption of chip space, and reduced risk of damage from ESD. The attenuator may provide accurate attenuation for a wide range of analog signal frequencies. For example, the attenuator may provide variable attenuation ranging from approximately 0% attenuation to approximately 100% attenuation for signal frequencies ranging from approximately 0.1 MHz to approximately 40 GHz. Other features and advantages of aspects of the present invention will be understood from the following detailed description.

Figure 3:
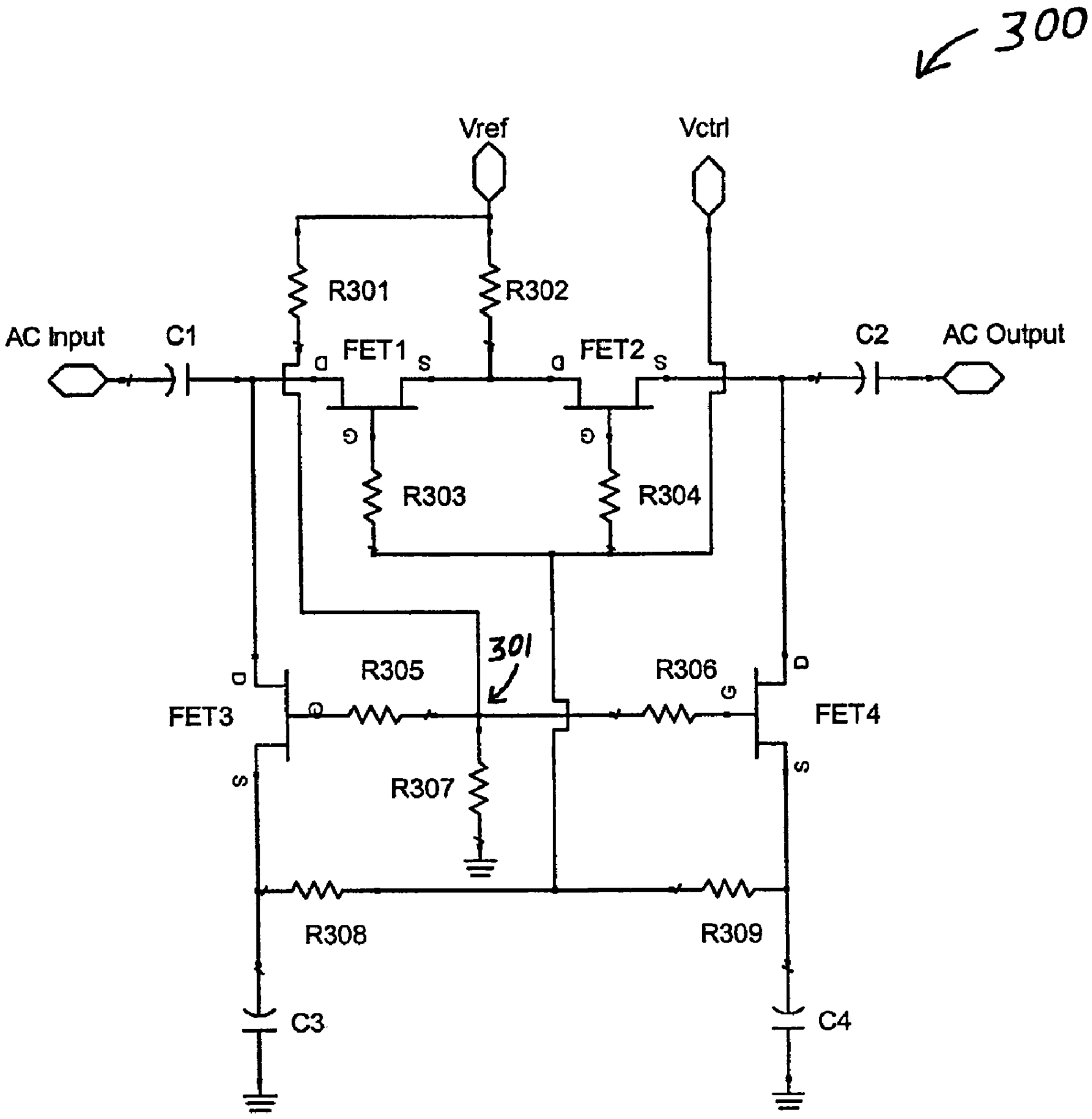
FIG. 3 is a schematic diagram of a π-type voltage-controlled variable attenuator according to an embodiment of the present invention.

FIG. 3 illustrates a π-type voltage-controlled variable attenuator according to an embodiment of the invention, and which can be implemented as an IC. The attenuator 300 is controlled using positive voltages Vref and Vctrl, and is therefore a positive voltage-controlled variable attenuator. The attenuator 300 comprises a series arm, two shunt arms, and a resistor biasing subcircuit. The attenuator 300 lacks capacitors between the series arm and the two shunt arms, and, as shown, lacks any internal capacitors.

The series arm of attenuator 300 comprises two variably resistive components. The first variably resistive component is shown as FET1 and the second variably resistive component is shown as FET2. However, the variably resistive components are not limited to being FETs, as any controllable variably resistive component could be used. An input signal AC Input is provided to DC block capacitor C1, which is coupled to the drain of FET1. The source of FET1 is coupled to the drain of FET2. The source of FET2 is coupled to DC block capacitor C2, from which the attenuator output signal AC Output is provided. The FETs of the series arm (e.g., FET1 and FET2) receive a positive, variable voltage Vctrl at their gates via respective resistors R303 and R304. Vctrl may be a supply voltage provided by a voltage source, or may be provided in any other manner, as the invention is not limited in this respect. An approximately constant voltage Vref is supplied between FET1 and FET2 via resistor R302, and in the embodiment of FIG. 3 is supplied to the source of FET1 and the drain of FET2, which are coupled to each other. Vref may be a supply voltage provided by a voltage source, or may be provided in any manner, as the invention is not limited in this respect. Furthermore, Vref may have any value, as the invention is not limited in this respect. For example, Vref may be any voltage in the range from approximately 2 Volts to approximately 20 Volts, or any other value.

The first shunt arm of attenuator 300 comprises a variably resistive component, shown as FET3. However, it will be appreciated that any type of controllable variably resistive component can be used, as the invention is not limited in this respect. The first shunt arm further comprises a DC block capacitor C3, which is coupled to FET3 and to ground. As shown, the first shunt arm is coupled to the series arm without any capacitor between the two. In the non-limiting example of FIG. 3, the variably resistive component of the first shunt arm (FET3) is coupled directly to one of the variably resistive components of the series arm (e.g., FET1).

The second shunt arm of attenuator 300 comprises a variably resistive component, shown as FET4. However, it will be appreciated that any type of controllable variably resistive component can be used, as the invention is not limited in this respect. The second shunt arm further comprises a DC block capacitor C4, which is coupled to FET4 and to ground. As shown, the second shunt arm is coupled to the series arm without any capacitor between the two. In the non-limiting example of FIG. 3, the variably resistive component of the second shunt arm (FET4) is coupled directly to one of the variably resistive components of the series arm (e.g., FET2).

The attenuator 300 further comprises various resistors, R301-R309, which can be said to constitute a resistor biasing subcircuit of the attenuator 300. Vref is provided via resistor R302 to the node at which the first and second variably resistive components of the series arm are coupled, i.e., the source of FET1 and the drain of FET2. Vctrl is provided to the gates of the variably resistive components of the series arm (e.g., the gate of FET1 and the gate of FET2) via resistors R303 and R304, respectively. The source terminal of FET3 and the source terminal of FET4 receive Vctrl through resistors R308 and R309, respectively. For example, one terminal of resistor R308 is coupled to Vctrl while a second terminal of resistor R308 is coupled to the source of FET3. Similarly, one terminal of resistor R309 is coupled to Vctrl while one terminal of resistor R309 is coupled to the source of FET4. The gate terminals of FET3 and FET4 receive Vref through a voltage divider configuration. As shown, resistors R301 and R307 are configured as a voltage divider, with R307 coupled to ground and R301 coupled to Vref. The midpoint of the voltage divider is node 301, to which the gate of FET3 is coupled by resistor R305 and the gate of FET4 is coupled by resistor R306. The voltage divider operates to maintain the gates of FET3 and FET4 above ground.

By varying the variable voltage Vctrl, the variably resistive components in attenuator 300 may be controlled to provide a variable degree of attenuation of the input signal AC Input. In one embodiment, Vctrl may have a value that can vary from approximately 0 Volts to approximately Vref, although the invention is not limited in this respect. As will be described in more detail, the resistances of the series arm and shunt arms move in opposite directions, such that when the resistance of the series arm is large the resistance of the shunt arms may be small, and vice versa.

Figure 4:
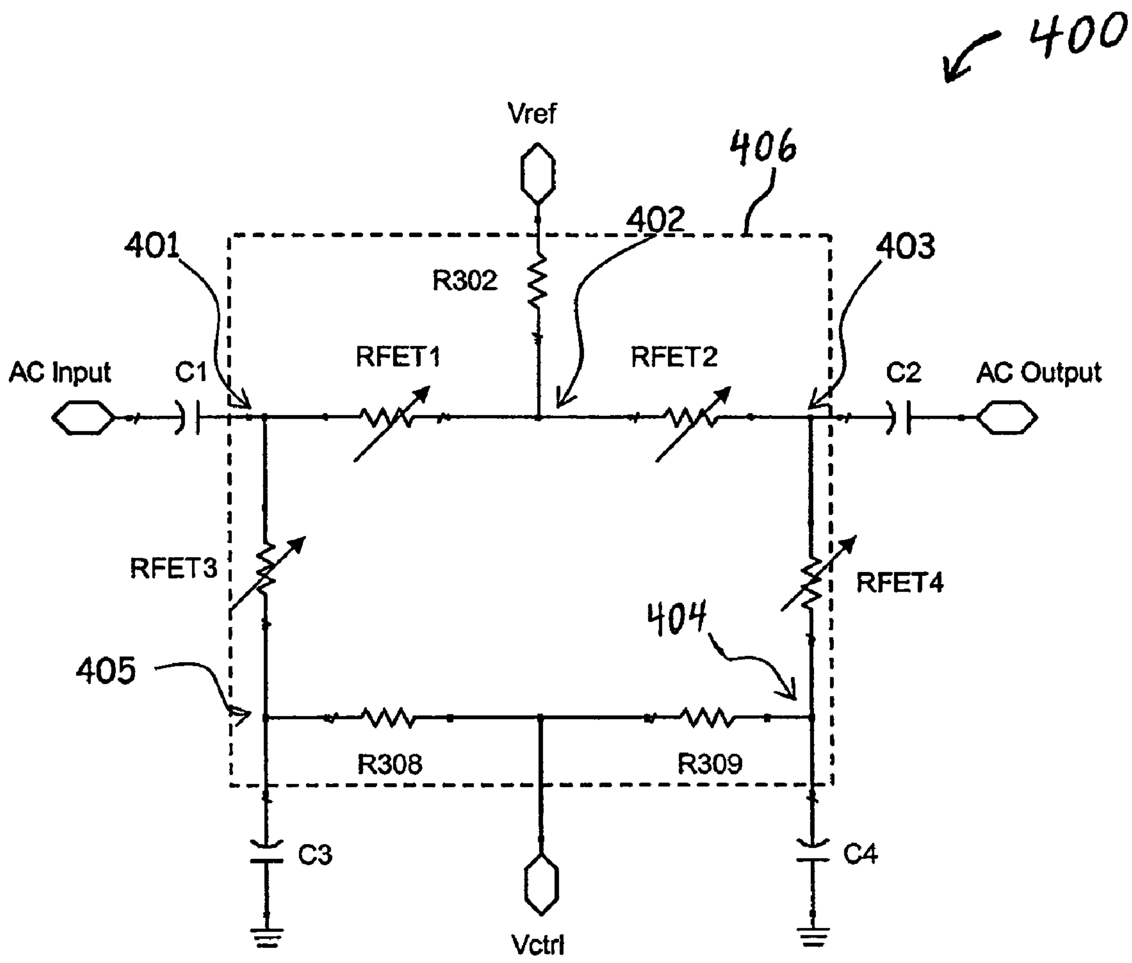
FIG. 4 is a schematic diagram of a DC bias circuit corresponding to the attenuator of FIG. 3.

The operation of attenuator 300 can be understood by consideration of the voltages at the gates and bodies of the FETs, which can be determined by reference to FIG. 4. Circuit 400 is a schematic of a DC bias circuit for the attenuator 300, and illustrates a DC bias resistor network, outlined by dashed frame 406. The variable resistors RFET1, RFET2, RFET3 and RFET4 represent the transistor channel resistance of FET1, FET2, FET3 and FET4, respectively, which varies according to the bias condition of each transistor. The voltage potentials at nodes 401, 402, 403, 404 and 405 (represented as V401, V402, V403, V404 and V405, respectively) can be derived from FIG. 4, and can be approximately given by:

$$V401 = V403 = \frac{(RFET3 + R308)}{2 \times R_{total}} \times \left[\left(\frac{Vref - Vctrl}{R302 + R_{total}}\right) \times R_{total} + Vctrl\right] + Vctrl$$

$$V402 = \frac{(Vref - Vctrl)}{(R302 + R_{total})} \times R_{total} + Vctrl$$

$$V404 = V405 = \frac{R308}{2 \times R_{total}} \times \left[\left(\frac{Vref - Vctrl}{R302 + R_{total}}\right) \times R_{total} + Vctrl\right] + Vctrl$$

where $$R_{total} = \frac{1}{2}(RFET1 + RFET3 + R308).$$

The value of the channel resistance of the FETs (i.e., RFETn) in the linear region of operation of the transistor is approximately given by:

$$RFET \approx [K(V_{gs} - V_p)]^{-1}$$

where K is a constant associated with factors such as transistor gate geometry and intrinsic electrical properties of the transistor. As stated earlier, $V_p$ is the pinch-off voltage of the transistor, and can be alternatively written as the threshold voltage $V_{TH}$. The values of the voltages V401-V405 demonstrate that the bodies of the FETs in attenuator 300 experience varying voltages, which is different from conventional π-type voltage-controlled variable attenuators which maintain the bodies of at least some FETs at constant voltages.

Using the voltages V401-V405 just derived, the value of $V_{gs}$, and therefore the bias condition, for each FET in attenuator 300 can be calculated as:

$$V_{gs1} = V_{gs2} = \frac{R308 + [K(V_{gs3} - V_p)]^{-1}}{2 \times R_T} \times \left[\left(\frac{Vref - Vctrl}{R302 + R_T}\right) \times R_T + Vctrl\right]$$

$$V_{gs3} = V_{gs4} = \frac{R307}{(R301 + R307)} \times Vref - \frac{R308}{2 \times R_T} \times \left[\left(\frac{Vref - Vctrl}{R302 + R_T}\right) \times R_T + Vctrl\right] - Vctrl$$

where $V_{gs1}$ corresponds to FET1, $V_{gs2}$ corresponds to FET2, $V_{gs3}$ corresponds to FET3, and $V_{gs4}$ corresponds to FET4. In those formulas, the value of $R_T$ is given by:

$$R_T = \frac{1}{2}\{[K(V_{gs1} - V_p)]^{-1} + [K(V_{gs3} - V_p)]^{-1} + R308\}$$

Figure 5:
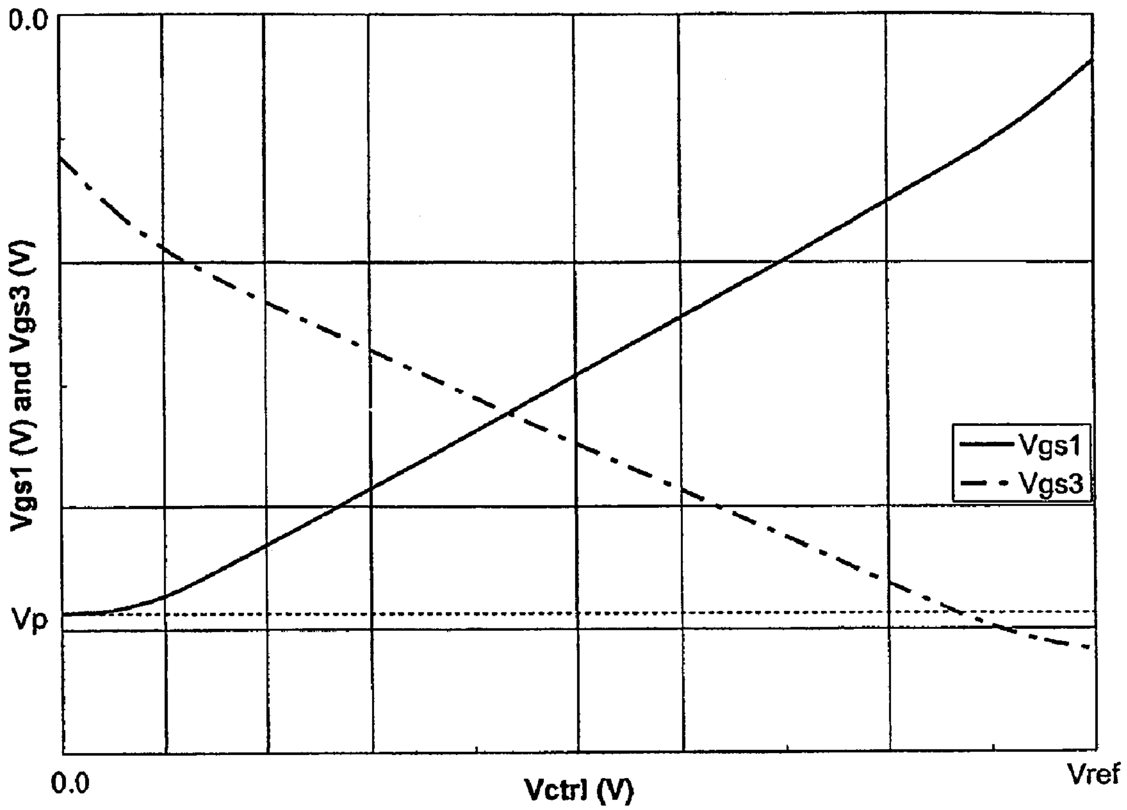
FIG. 5 is a graphical representation of the gate-to-source voltage for the FETs of FIG. 3.

The formulas for $V_{gs}$ for each FET in attenuator 300, as listed above, show that the bias conditions, and therefore the channel resistances, of the series arm FETs move opposite that of the shunt arm FETs. FIG. 5 illustrates this behavior. In particular, FIG. 5 illustrates simulation results for $V_{gs1}$ and $V_{gs3}$ as a function of varying voltage Vctrl, based upon the formulas developed above. As shown, $V_{gs1}=V_{gs2}$ varies from approximately $V_p$ to approximately 0 Volts as Vctrl is varied from approximately 0 Volts to approximately Vref. Meanwhile, $V_{gs3}=V_{gs4}$ varies from approximately 0 Volts to approximately $V_p$ as Vctrl varies from approximately 0 Volts to approximately Vref. The behavior illustrated in FIG. 5 indicates that the resistances of the series and shunt arms of attenuator 300 may vary in opposite directions, thus realizing an analog voltage-controlled variable attenuator that provides a variable degree of attenuation in dependence on the value of Vctrl.

Figure 6:
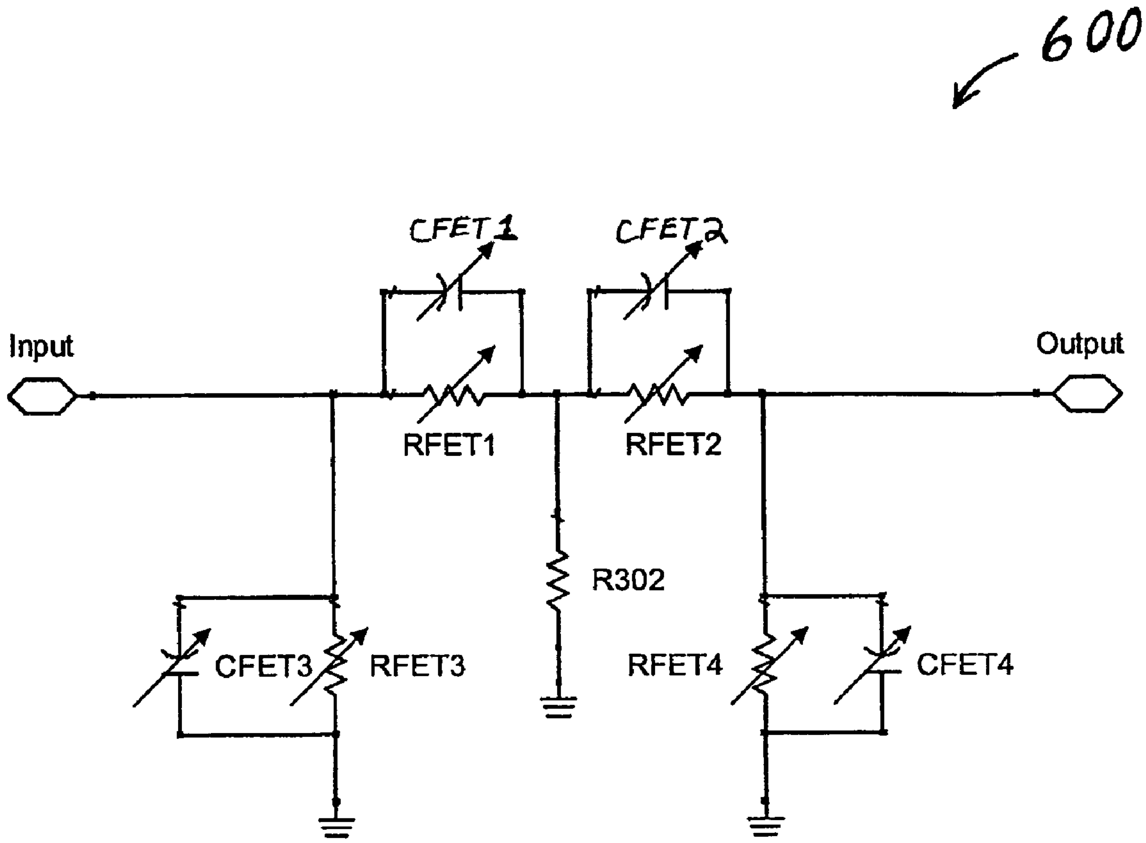
FIG. 6 is a schematic diagram of a small signal equivalent circuit of the attenuator of FIG. 3.

FIG. 6 illustrates a small signal equivalent circuit 600 of the attenuator 300. In FIG. 6, each FET of the attenuator 300 is represented by a variable resistance RFETn (where n is the index of the transistor, i.e., n=1, 2, 3, or 4) in parallel with a variable capacitance CFETn. The values of RFETn and CFETn may depend on the bias condition of the corresponding FET. As shown, the small signal circuit 600 lacks DC block capacitors between the series and shunt arms.

Figure 7:
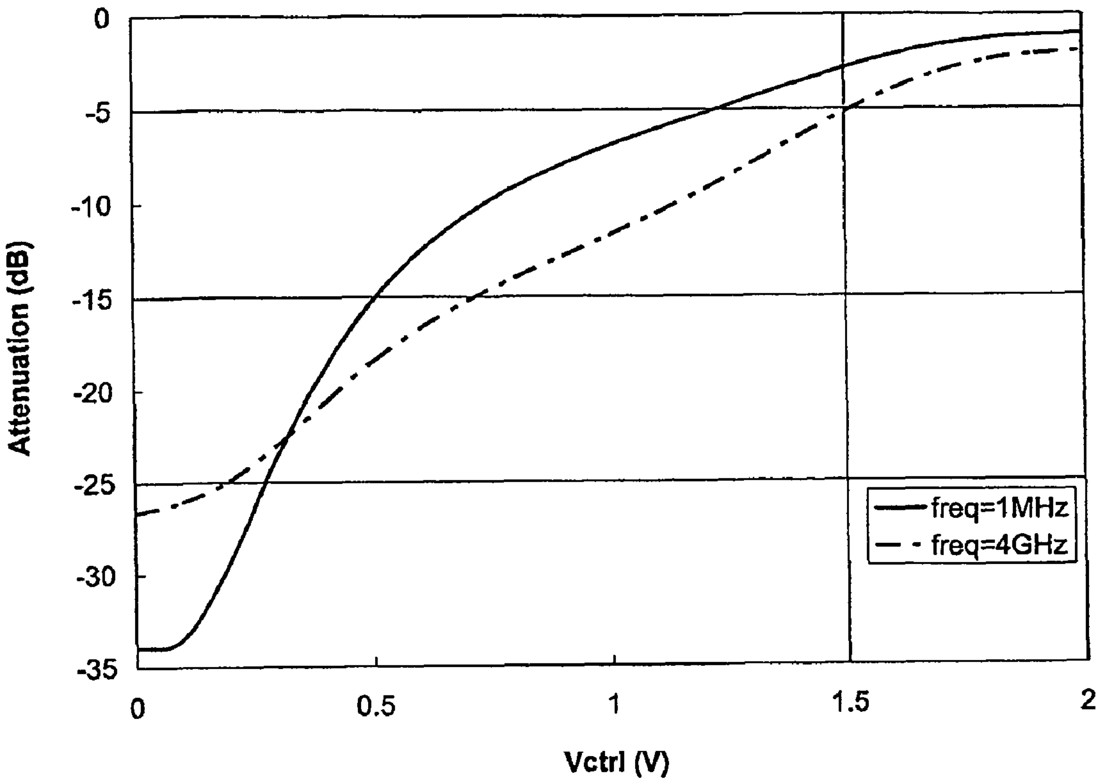
FIG. 7 is a graphical representation of variable attenuation that can be provided by an attenuator according to aspects of the present invention.

FIG. 7 illustrates one non-limiting example of the attenuation that may be achieved using an attenuator according to aspects of the present invention, such as attenuator 300. As shown, the degree of attenuation may vary with the value of the variable voltage Vctrl. As shown, variable attenuation can be provided for signals having a wide range of frequencies, such as 1 MHz or 4 GHz. The dashed line indicates that an input signal having a frequency of 4 GHz may be attenuated from approximately is 0 dB to approximately −35 dB depending on the value of Vctrl. Similarly, the solid line shows that a signal having a frequency of 1 MHz may experience attenuation ranging from approximately 0 dB to approximately −30 dB depending on the value of Vctrl. In the non-limiting example of FIG. 7, Vctrl is illustrated as varying between 0 Volts and 2 Volts. However, as previously mentioned, the values of Vref and Vctrl are not limiting, as any value may be used for these voltages. According to some embodiments, variable attenuation ranging from approximately 0% attenuation to approximately 100% attenuation may be provided for signals having a frequency as low as 0.1 MHz or as high as 40 GHz.

It will be appreciated that the shape of the attenuation curves shown in FIG. 7, as well as the degree of attenuation shown for each curve, is non-limiting, and may vary depending on the value of the components in attenuator 300, i.e., the values of the resistors, capacitors, etc. For example, the difference in attenuation illustrated in FIG. 7 for the 1 MHz signal and the 4 GHz signal may depend at least partially on the parasitic elements of the FETs, such as CFETn, which may vary with the bias condition of the corresponding FET.

It will be appreciated that FIGS. 3-7, and the corresponding description are not limiting, and that various modifications may be made to the circuits and concepts shown and discussed. For example, the FETs in FIG. 3 could be implemented as single-gate or multi-gate FETs, as the invention is not limited in this respect. Moreover, one or more of the FETs in FIG. 3 could be replaced by multiple FETs in series to provide increased resistance, or could be implemented by a single multi-gate FET have two or more gates. For example, each FET shown in FIG. 3 may comprise a single multi-gate FET having as many as six gates. Similarly, each FET shown could be replaced by a plurality of multi-gate FETs connected in series, with each multi-gate FET having as many as six gates.

Furthermore, the values of the components shown in FIGS. 3-7 are non-limiting. For example, the values of C1, C2, C3, and C4 may be chosen or designed in dependence on the desired range of signal frequencies which the attenuator may operate on, and the invention is not limited to any particular values for capacitors C1, C2, C3, and C4. Similarly, the values of the resistors and capacitors of attenuator 300 may be chosen to optimize desired operating characteristics of the attenuator. For example, the values of the resistors of attenuator 300 may be chosen so that the values of $V_{gs1}$ and $V_{gs3}$ (given in the equations above with regard to FIGS. 4-5) may range from approximately 0 Volts to approximately the value of $V_p$.

Moreover, it will be appreciated that the description of components in relation to FIGS. 3-7 is non-limiting. For example, some of the resistors have been described as belonging to a resistor biasing subcircuit. However, it will be appreciated that this grouping is meant for purposes of description only, and that the components could be described as being grouped differently.

As has been mentioned, various benefits and advantages may be realized by use of one or more aspects of the present invention. For example, as mentioned, according to an aspect of the present invention a π-type positive voltage-controlled variable attenuator is provided that lacks DC block capacitors between the series and shunt arms. Any capacitors implemented may thus be external to the attenuator (e.g., capacitors C1, C2, C3, and C4 in FIG. 3), such that one or more of them may be implemented off-chip, conserving valuable chip space for other components and/or other circuits. The amount of chip area conserved by the lack of internal DC block capacitors may be large, and may be anywhere from 0.01 $mm^2$ to 0.1 $mm^2$, or larger. Other benefits and advantages are also possible.

This invention is not limited in its application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A π-type voltage-controlled variable attenuator, comprising:

- a series arm configured to receive an input signal and output an attenuated signal, the series arm comprising:
  - a first variably resistive component comprising a first field effect transistor (FET); and
  - a second variably resistive component coupled in series with the first variably resistive component, the second variably resistive component comprising a second FET;
- a first shunt arm comprising a third variably resistive component comprising a third FET, the first shunt arm coupled to the first variably resistive component; and
- a second shunt arm comprising a fourth variably resistive component comprising a fourth FET, the second shunt atm coupled to the second variably resistive component;
- wherein the attenuator lacks a capacitor configured to isolate the first variably resistive component from the first shunt arm;
- wherein the attenuator lacks a capacitor configured to isolate the second variably resistive component from the second shunt arm.

2. The π-type voltage-controlled variable attenuator of claim 1, wherein the lack of a capacitor configured to isolate the first variably resistive component from the first shunt arm is implemented as a short circuit between the first variably resistive component and the third variably resistive component.

3. The π-type voltage-controlled variable attenuator of claim 2, wherein the lack of a capacitor configured to isolate the second variably resistive component from the second shunt arm is implemented as a short circuit between the second variably resistive component and the fourth variably resistive component.

4. A π-type voltage-controlled variable attenuator, comprising:

- a series arm configured to receive an input signal and output an attenuated signal, the series arm comprising:
  - a first variably resistive component; and
  - a second variably resistive component coupled in series with the first variably resistive component;
- a first shunt arm comprising a third variably resistive component, the first shunt arm coupled to the first variably resistive component; and
- a second shunt arm comprising a fourth variably resistive component, the second shunt arm coupled to the second variably resistive component;
- wherein the attenuator lacks a capacitor configured to isolate the first variably resistive component from the first shunt arm;
- wherein the attenuator lacks a capacitor configured to isolate the second variably resistive component from the second shunt arm;
- wherein the lack of a capacitor configured to isolate the first variably resistive component from the first shunt arm is implemented as a short circuit between the first variably resistive component and the third variably resistive component
- wherein the lack of a capacitor configured to isolate the second variably resistive component from the second shunt arm is implemented as a short circuit between the second variably resistive component and the fourth variably resistive component
- wherein the third variably resistive component comprises a third field effect transistor (FET) comprising a gate terminal, and the fourth variably resistive component comprises a fourth FET comprising a gate terminal;
- wherein the gate terminal of the third FET and the gate terminal of the fourth FET are coupled to an approximately constant voltage supply via a voltage divider.

5. The π-type voltage-controlled variable attenuator of claim 4, wherein the first variably resistive component comprises a first FET and the second variably resistive component comprises a second FET.

6. The π-type voltage-controlled variable attenuator of claim 5, wherein at least one of the first FET, the second FET, the third FET, and the fourth FET is a multi-gate FET.

7. The π-type voltage-controlled variable attenuator of claim 5, wherein each of the first FET, the second FET, the third FET, and the fourth FET is a single-gate FET.

8. The π-type voltage-controlled variable attenuator of claim 5, wherein at least one of the first variably resistive component, the second variably resistive component, the third variably resistive component, and the fourth variably resistive component comprises a plurality of FETs connected in series.

9. The π-type voltage-controlled variable attenuator of claim 8, wherein each FET of the plurality of FETs connected in series is a multi-gate FET.

10. The π-type voltage-controlled variable attenuator of claim 8, wherein each FET of the plurality of FETs connected in series is a single-gate FET.

11. A π-type voltage-controlled variable attenuator, comprising:

a series arm configured to receive an input signal and output an attenuated signal, the series arm comprising:

a first variably resistive component comprising a first field effect transistor (FET); and a second variably resistive component coupled in series with the first variably resistive component, the second variably resistive component comprising a second FET;

a first shunt arm comprising a third variably resistive component directly coupled to the first variably resistive component, the third variably resistive component comprising a third FET; and a second shunt arm comprising a fourth variably resistive component directly coupled to the second variably resistive component, the fourth variably resistive component comprising a fourth FET.

12. A π-type voltage-controlled variable attenuator, comprising:

a series arm configured to receive an input signal and output an attenuated signal, the series arm comprising:

a first variably resistive component; and a second variably resistive component coupled in series with the first variably resistive component;

a first shunt arm comprising a third variably resistive component directly coupled to the first variably resistive component; and a second shunt arm comprising a fourth variably resistive component directly coupled to the second variably resistive component, wherein the third variably resistive component comprises a third field effect transistor (FET) comprising a gate terminal, and the fourth variably resistive component comprises a fourth FET comprising a gate terminal; and wherein the gate terminal of the third FET and the gate terminal of the fourth FET are coupled to an approximately constant voltage supply via a voltage divider.

13. The π-type voltage-controlled variable attenuator of claim 12, wherein the first variably resistive component comprises a first FET and the second variably resistive component comprises a second FET.

14. The π-type voltage-controlled variable attenuator of claim 13, wherein at least one of the first FET, the second FET, the third FET, and the fourth FET is a multi-gate FET.

15. The π-type voltage-controlled variable attenuator of claim 13, wherein each of the first FET, the second FET, the third FET, and the fourth FET is a single-gate FET.

16. The π-type voltage-controlled variable attenuator of claim 13, wherein at least one of the first variably resistive component, the second variably resistive component, the third variably resistive component, and the fourth variably resistive component comprises a plurality of FETs connected in series.

17. The π-type voltage-controlled variable attenuator of claim 16, wherein each FET of the plurality of FETs connected in series is a multi-gate FET.

18. The π-type voltage-controlled variable attenuator of claim 16, wherein each FET of the plurality of FETs connected in series is a single-gate FET.

19. A voltage-controlled variable attenuator, comprising:

a series arm comprising:

a first variably resistive component comprising a first field effect transistor (FET); and a second variably resistive component comprising a second FET, the series arm configured to receive an input signal and provide an output signal attenuated relative to the input signal;

a first shunt arm coupled to the series arm, the first shunt arm comprising:

a third variably resistive component comprising a third FET; and a first capacitor having a first terminal coupled to the third variably resistive component at a first node and a second terminal coupled to ground;

a second shunt arm coupled to the series arm, the second shunt arm comprising:

a fourth variably resistive component comprising a fourth PET; and a second capacitor having a first terminal coupled to the fourth variably resistive component at a second node and a second terminal coupled to ground;

a first resistor having a first terminal coupled to a variable voltage and a second terminal coupled to the first node; and a second resistor having a first terminal coupled to the variable voltage and a second terminal coupled to the second node.

20. The voltage-controlled variable attenuator of claim 19, wherein the variable voltage is provided by a variable voltage supply.

21. The voltage-controlled variable attenuator of claim 19, wherein the first variably resistive component is coupled to the second variably resistive component.

22. The voltage-controlled variable attenuator of claim 21, wherein the series arm further comprises a third capacitor coupled to the first variably resistive component and configured to receive the input signal, and a fourth capacitor coupled to the second variably resistive component and configured to provide the output signal.

23. A voltage-controlled variable attenuator, comprising:

a series arm comprising a first variably resistive component and a second variably resistive component, the series arm configured to receive an input signal and provide an output signal attenuated relative to the input signal;

a first shunt arm coupled to the series arm, the first shunt arm comprising:

a third variably resistive component; and a first capacitor having a first terminal coupled to the third variably resistive component at a first node and a second terminal coupled to ground;

a second shunt arm coupled to the series arm, the second shunt arm comprising:

a fourth variably resistive component; and a second capacitor having a first terminal coupled to the fourth variably resistive component at a second node and a second terminal coupled to ground;

a first resistor having a first terminal coupled to a variable voltage and a second terminal coupled to the first node; and a second resistor having a first terminal coupled to the variable voltage and a second terminal coupled to the second node, wherein the first variably resistive component is coupled to the second variably resistive component, wherein the series arm further comprises a third capacitor coupled to the first variably resistive component and configured to receive the input signal, and a fourth capacitor coupled to the second variably resistive component and configured to provide the output signal, wherein the third variably resistive component comprises a third field effect transistor (FET) comprising a gate terminal and wherein the fourth variably resistive component comprises a fourth FET comprising a gate terminal.

24. The voltage-controlled variable attenuator of claim 23, further comprising a voltage divider coupled between an approximately constant voltage supply and ground, the voltage divider comprising:

a third resistor; and a fourth resistor coupled to the third resistor at a third node; and wherein the gate terminal of the third FET is coupled to the third node and the gate terminal of the fourth FET is coupled to the third node.

25. The voltage-controlled variable attenuator of claim 24, wherein the gate terminal of the third FET is coupled to the third node by a fifth resistor, and wherein the gate terminal of the fourth FET is coupled to the third node by a sixth resistor.

26. The voltage-controlled variable attenuator of claim of 23, wherein the first variably resistive component comprises a first FET and the second variably resistive component comprises a second FET.

27. The voltage-controlled variable attenuator of claim 26, wherein at least one of the first FET, the second FET, the third FET, and the fourth FET is a multi-gate FET.

28. The voltage-controlled variable attenuator of claim 26, wherein each of the first FET, the second FET, the third FET, and the fourth FET is a single-gate FET.

29. The voltage-controlled variable attenuator of claim of 26, wherein the first FET has a gate terminal configured to receive the variable voltage and wherein the second FET has a gate terminal configured to receive the variable voltage.

30. The voltage-controlled variable attenuator of claim 29, wherein the third FET has a source terminal configured to receive the variable voltage via an eighth resistor, and wherein the fourth FET has a source terminal configured to receive the variable voltage via a ninth resistor.

31. The voltage-controlled variable attenuator of claim 26, wherein at least one of the first variably resistive component, the second variably resistive component, the third variably resistive component, and the fourth variably resistive component comprises a plurality of FETs connected in series.

32. The π-type voltage-controlled variable attenuator of claim 31, wherein each FET of the plurality of FETs connected in series is a single-gate FET.

33. The π-type voltage-controlled variable attenuator of claim 31, wherein each FET of the plurality of FETs connected in series is a multi-gate FET.

* * * * *

UNITED STATES PATENT AND TRADEMARK OFFICE

CERTIFICATE OF CORRECTION

PATENT NO. : 7,839,233 B2
APPLICATION NO. : 12/009919
DATED : November 23, 2010
INVENTOR(S) : Yibing Zhao and Shuyun Zhang It is certified that error appears in the above-identified patent and that said Letters Patent is hereby corrected as shown below:

At column 2, line 62, change "RI 04," to -- R104, -- therefor.

At column 8, line 30, after "approximately" delete "is" therefor.

At column 10, line 3, in Claim 1, change "atm" to -- arm -- therefor.

At column 10, lines 44-45, in Claim 4, change "component" to -- component; -- therefor.

At column 10, line 50, in Claim 4, change "component" to -- component; -- therefor.

At column 12, line 25, in Claim 19, change "PET;" to -- FET; -- therefor.

Signed and Sealed this
Twenty-fourth Day of May, 2011

David J. Kappos
*Director of the United States Patent and Trademark Office*